United States Patent
Yun et al.

(10) Patent No.: US 7,560,963 B2
(45) Date of Patent: Jul. 14, 2009

(54) DELAY-LOCKED LOOP APPARATUS AND DELAY-LOCKED METHOD

(75) Inventors: Won Joo Yun, Seoul (KR); Hyun Woo Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 63 days.

(21) Appl. No.: 11/683,500

(22) Filed: Mar. 8, 2007

(65) Prior Publication Data

US 2007/0262798 A1  Nov. 15, 2007

(30) Foreign Application Priority Data

May 12, 2006  (KR)  ........................ 10-2006-0043014

(51) Int. Cl.
  *H03L 7/06*  (2006.01)
(52) U.S. Cl. ........................ 327/158; 327/149; 327/161; 327/175
(58) Field of Classification Search ................. 327/141, 327/149, 150, 152, 153, 155, 158, 159, 161–163, 327/172–176
See application file for complete search history.

(56) References Cited

U.S. PATENT DOCUMENTS 7,161,397 B2 *  1/2007  Lee et al. ..................... 327/149
7,282,974 B2 * 10/2007  Lee ............................. 327/158
7,385,428 B2 *  6/2008  Lee et al. ..................... 327/149
2006/0001463 A1 *  1/2006  Lee et al. ..................... 327/147
2007/0200604 A1 *  8/2007  Yun et al. ..................... 327/158

FOREIGN PATENT DOCUMENTS

| KR | 1020030078129 | 10/2003 |
| KR | 1020040085631 | 10/2004 |
| KR | 1020050013737 | 2/2005 |
| KR | 1020050097700 | 10/2005 |
| KR | 1020050104835 | 11/2005 |

OTHER PUBLICATIONS

Notice of Patent Grant mailed Jan. 15, 2008 for the corresponding KR10-2006-0043014.

* cited by examiner

*Primary Examiner*—Lincoln Donovan
*Assistant Examiner*—Patrick O'Neill
(74) *Attorney, Agent, or Firm*—Ladas & Parry LLP

(57) ABSTRACT

A delay-locked loop device compensates a skew between an external clock and data or between an external clock and an internal clock particularly by applying a single delay model portion, a complementary phase multiplexing, and a cascade delay line. This device performs an operation by selecting any one of an external clock signal (CLK) and an inverted external clock signal (CLKB) using a multiplexing portion 200, aligning the selected clock signal at a rising edge of the external clock signal (CLK) through a first single coarse delay line 212, a first dual coarse delay line 222, and a first fine delay unit 223 according to the phase comparison with a feedback clock signal (FBCLK) through a delay model portion 250, then receiving a clock signal through the first single coarse delay line 212 to the second single coarse delay line 214 to align the rising edges of the rising clock signal (RCLK) and the falling clock signal (FCLK).

37 Claims, 7 Drawing Sheets

DELAY-LOCKED LOOP APPARATUS AND DELAY-LOCKED METHOD

CROSS-REFERENCE TO RELATED APPLICATIONS

The present application claims priority to Korean patent application number 10-2006-0043014 filed on May 12, 2006, which is incorporated herein by reference in its entirety.

BACKGROUND OF THE INVENTION

The present invention relates to a delay-locked loop device, and more particularly, to a delay-locked loop device and a delay-locked method thereof which compensates a skew between an external clock and data or a skew between an external clock and an internal clock particularly by applying a single delay model portion, a complementary phase multiplexing, and a cascade delay line.

In general, a delay-locked loop is a circuit which delays an internal clock of a synchronous memory using a clock in a semiconductor memory device to coincide with an external clock without an error. In other words, when a clock coming from the outside is used in the inside, a skew is likely to occur between an external clock and an internal clock or to occur between an external clock and data. Accordingly, a delay-locked loop is often used to reduce such a skew.

In recent years, studies have continued in the direction of how to minimize variable delay times in order to reduce or minimize jitter in delay-locked loops. For this purpose a delay-locked loop is presented having a hierarchical delay line structure which includes a coarse delay line and a fine delay unit.

As an example, a delay-locked loop in a related art, as illustrated in FIG. 1, includes a buffer portion 100, a delay line portion 110, a duty error adjustment portion 120, a first delay model portion 130, a first phase detecting portion 140, a second delay model portion 150, and a second phase detecting portion 160.

The buffer portion 100 receives an external clock signal (CLK) to output a clock input signal, which is activated at an edge of the clock.

The delay line portion 110 receives the clock input signal from the buffer portion 100 and delays the clock input signal for a predetermined amount of time by using a first and a second detection signals provided from a first and a second phase detection portions 140 and 160 in order to output a first and a second clock signals (INTCLK1 and INTCLK2, respectively).

The duty error adjustment portion 120 receives the first and second clock signals (INTCLK1 and INTCLK2, respectively) from the delay line portion 110 and moves each edge of the first and the second clock signals (INTCLK1, INTCLK2) between a falling edge of the first clock signal (INTCLK1) and a falling edge of the second clock signal (INTCLK2) to output a mixed clock signal (INT_CLK).

The first delay model portion 130 receives the clock input signal and makes a replica delay to output as a first delay clock signal (ICLK1).

The first phase detecting portion 140 receives the external clock signal (CLK) and compares with the first delay clock signal (ICLK1) outputted from the first delay model portion 130 to generate the first detection signal.

The second delay model portion 150 receives a signal having an opposite phase to the clock input signal and makes a replica delay to output as a second delay clock signal (ICLK2).

The second phase detecting portion 160 receives the external clock signal (CLK) and compares with the second delay clock signal (ICLK2) outputted from the second delay model portion 150 to generate the second detection signal.

A delay-locked loop in the related art controls a delay amount of the delay line portion 110 by using the first and the second detection signals to align the rising edges of the first clock signal (INTCLK1) and the second clock signal (INTCLK2), and subsequently corrects a duty cycle of the first and the second clock signals (INTCLK1, INTCLK2) using the duty error adjustment portion 120.

At this time, both the first and the second delay model portions 130 and 150 perform a similar type of operation before a duty cycle correction operation. However, the second delay model portion 150 is not used after aligning the rising edges of the first clock signal (INTCLK1) and the second clock signal (INTCLK2) and then operating the duty error adjustment portion 120.

As a result, a delay-locked loop in the related art exhibits an efficiency problem in that an unnecessary amount of current is consumed after starting a duty cycle correction operation. This is because there remains an unnecessary but active circuit, that is, the second delay model part 150, that consumes current and occupies an unnecessary area.

Furthermore, when the second delay model portion 150 is switched to an OFF-state then an instantaneous current is consumed. This switching can generate a jitter which results in a problem that an additional locking time is required due to correct and avoid any adverse affects from this jitter.

On the other hand, the delay line part 110 includes a coarse delay line having a plurality of unit delay cells and a fine delay unit having a phase mixer, and the coarse delay line can be divided into a single coarse delay line in which a plurality of unit delay cells are serially connected and a dual coarse delay line in which coarse delay lines are dually connected.

After a coarse locking by the coarse delay line has been achieved, the delay line portion 110 having a single coarse delay line uses a weight factor during a fine tuning operation in the phase mixer.

At this time, when a shift is generated at a boundary of the phase mixer in the coarse delay line, the weight value should be reset again to maintain an output phase of the phase mixer. If a shift timing of the coarse delay line does not accurately coincide with a reset timing of the phase mixer, then in this case, a jitter can be generated at an output portion of the phase mixer. The delay line portion 110 has a dual coarse delay line having a structure in which two coarse delay lines are connected to a fine delay line, in which each coarse delay line operates with a difference from each other by a unit delay cell. In such a dual coarse delay line, an inputted clock is shifted using an odd-numbered unit delay cell in any one of the two coarse delay lines, and is shifted using an even-numbered unit delay cell in the other one of the coarse delay lines. Therefore a weight factor of the phase mixer does not have to be reset in the dual coarse delay line.

Nevertheless, when a dual coarse delay line is used, a boundary switching problem of the single coarse delay line can be resolved. However there is a problem in that a large area is occupied and also the current consumption is large because coarse delay lines are dually used.

SUMMARY OF THE INVENTION

Figure 1:
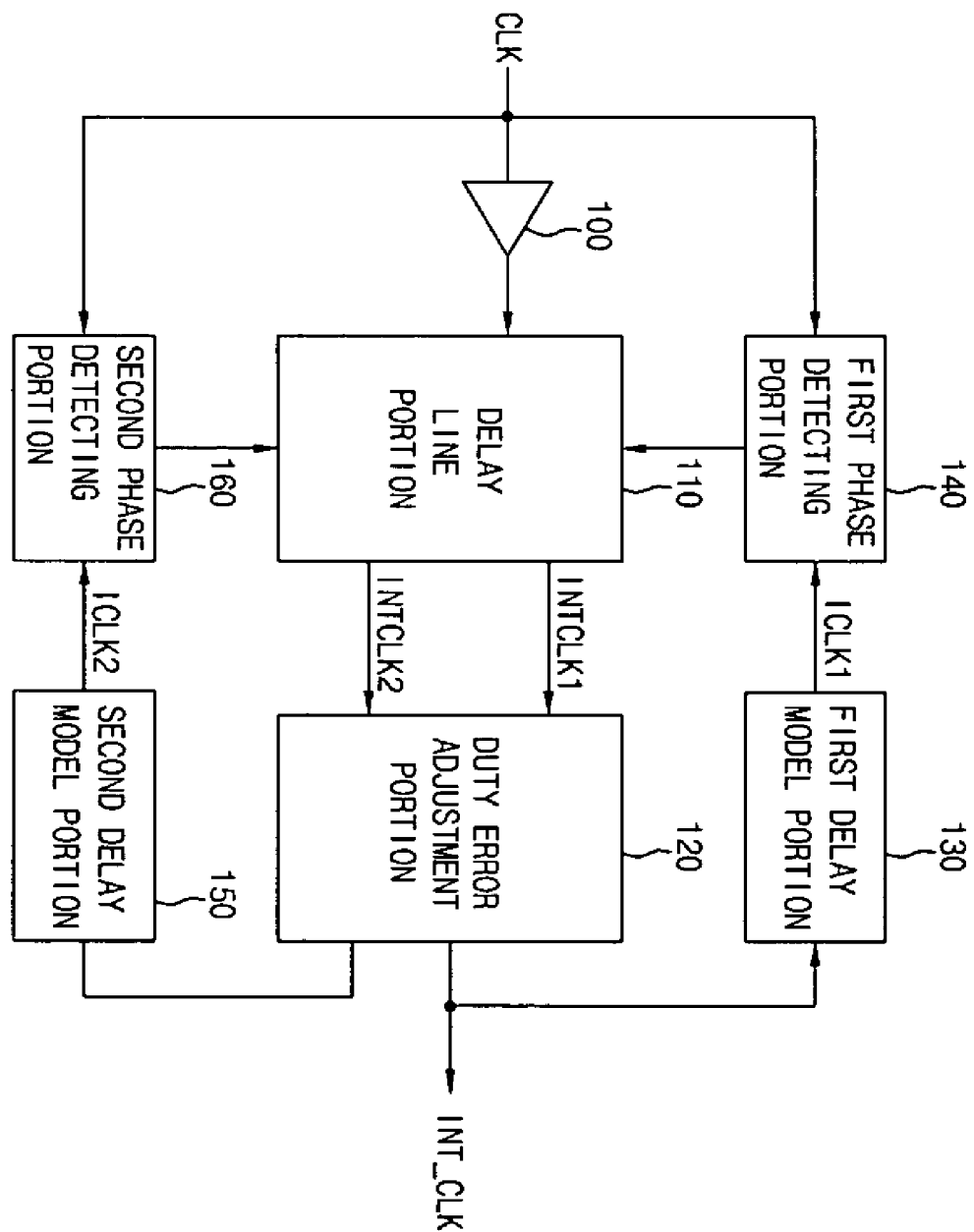
FIG. 1 is a block diagram showing a delay-locked loop according to a related art.

A delay-locked loop device according to an embodiment of the present invention comprises a rising clock delay-locked circuit which performs a delay and locking operation for a rising clock from a first clock inputted as a reference and from a second clock that is replica delayed from the first clock. When a phase difference greater than a predetermined range is generated by comparing a phase difference between the first clock and the second clock, then a dual coarse delay line correcting the first clock to have a phase difference within the predetermined delay range based upon the second clock is included in the delay and locking process; when the delay and locking operation for the rising clock is completed then a falling clock delay-locked circuit which performs a delay and locking operation for a falling clock with the first clock; a control circuit which controls the rising clock delay-locked circuit and the falling clock delay-locked circuit in order to sequentially control the delay and locking operation for the rising clock and the falling clock; and a duty cycle correction circuit which performs a duty cycle correction operation for the delayed-locked rising clock and falling clock outputted from the rising clock delay-locked circuit and the falling clock delay-locked circuit to output an output clock.

In the above configuration, preferably, the rising clock delay-locked circuit comprises a replica delay portion which makes a replica delay of the first clock to output to the second clock; a first phase detecting portion which compares the first and second clock phases in order to output a first detection signal; a multiplexing portion using the first detection signal selects any one of the first clock and an inverted clock having an opposite phase to the first clock; a first single coarse delay line portion which determines a delay amount of a first delay clock from the first detection signal and delays a clock selected from the multiplexing portion for a predetermined time in order to output a first delay clock, and; a first dual coarse delay line portion which delays the first delay clock to have a phase difference within the predetermined delay range based upon the second clock in order to output a second and a third delay clock when a phase difference greater than a predetermined range is generated between the first clock and the second clock is determined with the first detection signal; and a first fine delay unit which mixes the second and the third delay clock phases to output to the rising clock.

In the above configuration, preferably, the multiplexing portion selects any one of the first clock and the inverted clock using the first detection signal so as to align any one of the first clock and the inverted clock with the second clock for a delay time within a half period of the second clock.

In the above configuration, preferably, the multiplexing portion includes a first input buffer which uses an external clock to generate the first clock having a same phase with the external clock; a second input buffer which uses a clock having an opposite phase to the external clock to generate the inverted clock having a same phase with the clock having an opposite phase to the external clock; a clock selector which generates a clock selecting signal with the first detection signal to determine which one of the first clock and the inverted clock is delayed; and a multiplexer using the clock selecting signal to output selectively outputs any one of the first clock and the inverted clock.

In the above configuration, preferably, the first input buffer receives the external clock from a non-inverted terminal, and receives a clock having an opposite phase from the external clock to an inverted terminal.

In the above configuration, preferably, the second input buffer receives a clock having an opposite phase from the external clock into a non-inverted terminal, and receives the external clock into an inverted terminal.

In the above configuration, preferably, the first single coarse delay line portion comprises multiple serially connected unit delay cells, and a number of unit delay cells being passed by a clock which is selected from the multiplexing portion. The clock selected from the multiplexer portion is determined using the first detection signal.

In the above configuration, preferably, the first dual coarse delay line portion comprises a first coarse delay line having 'n' serially connected unit delay cells (here, 'n' is an integer greater than 1) in which the first delay clock passes through 'h' activated unit delay cells (here, 'h' is an integer not more than 'n') using the first detection signal to output to the second delay clock; and a second coarse delay line having 'n+1' serially connected unit delay cells in which the first delay clock passes through 'h+1' activated unit delay cells using the first detection signal to output to the third delay clock.

In the above configuration, preferably, the first fine delay line portion determines a weight factor using the first detection signal, and includes a phase mixer which adds a result of multiplying a level of the second delay clock by using a value of subtracting the weight factor from 1 to a result of multiplying a level of the third delay clock by using the weight factor to output to the rising clock.

In the above configuration, preferably, the fall clock delay-locked circuit comprises a second phase detecting portion which compares the delay and locking completed rising clock and the falling clock phases to output a second detection signal; a second single coarse delay line portion which inverts a clock delayed from the first clock and then delays for a predetermined time to output a fourth delay clock when the delay and locking operation for the rising clock is completed, and determines a delay amount of the fourth delay clock using the second detection signal; a second dual coarse delay line portion which delays the fourth delay clock to have a phase difference within the predetermined delay range based upon the delay and locking completed rising clock in order to output a fifth and a sixth delay clock when it is determined with the second detection signal that a phase difference greater than a predetermined range is generated between the delay and locking completed rising clock and the falling clock; and a second fine delay unit which mixes the fifth and the sixth delay clock phases to output the falling clock.

In the above configuration, preferably, the second single coarse delay line portion inverts the first delay clock outputted from the first single coarse delay line portion, and then delays for a predetermined time to output the second delay clock.

In the above configuration, preferably, the second single coarse delay line portion comprises multiple serially connected unit delay cells, and a number of unit delay cells being passed by a clock having an opposite phase to the clock delayed from the first clock which is determined by the second detection signal.

In the above configuration, preferably, the second dual coarse delay line portion comprises a first coarse delay line having 'n' serially connected unit delay cells (here, 'n' is an integer greater than 1) in which the fourth delay clock passes through 'h' activated unit delay cells (here, 'h' is an integer not more than 'n') using the second detection signal to output the fifth delay clock; and a second coarse delay line having 'n+1' serially connected unit delay cells in which the fourth delay clock passes through 'h+1' activated unit delay cells using the first detection signal to output the sixth delay clock.

In the above configuration, preferably, the second fine delay line portion determines a weight factor using the second detection signal, and includes a phase mixer which adds a result of multiplying a level of the fifth delay clock by a value of subtracting the weight factor from 1 to a result of multiplying a level of the sixth delay clock using the weight factor to output the falling clock.

In the above configuration, preferably, the control circuit comprises a first control portion which controls a delay and locking operation for the rising clock using a first detection signal by which the first and the second clock phases are compared; a second control portion which controls a delay and locking operation for the falling clock using a second detection signal by which the delay and locking completed rising clock and the falling clock phases are compared; a locking sensing portion which controls a delay and locking operation for the rising clock and a delay and locking operation for the falling clock using the first and the second detection signal; and a loop selector portion which selects any one of the first and the second control portions by the second detection signal to operate.

In the above configuration, preferably, the locking sensing portion deactivates a delay and locking operation for the falling clock before a delay and locking operation for the rising clock is completed, and activates a delay and locking operation for the falling clock at a timing when a delay and locking operation for the rising clock is completed.

In the above configuration, preferably, the duty cycle correction circuit comprises a third phase detecting portion which compares the rising clock and the falling clock phases to output a third detection signal; a duty cycle correction control portion which generates control signals for controlling a phase mixing operation using the third detection signal; and a duty cycle correction portion which performs a phase mixing operation between the rising clock and the falling clock with the control signals generated from the duty cycle correction control portion to output the output clock.

A delay-locked loop device according to another embodiment of the present invention comprises: a delay-locked circuit which performs a delay and locking operation for a rising clock with any one of a first clock as a reference and a clock inverted from the first clock, and with a second clock replica delayed from the first clock, and which performs the delay and locking operation for a falling clock with the first clock when the delay and locking operation for the rising clock is completed; and a duty cycle correction circuit which performs a duty cycle correction operation for the delayed-locked rising clock and falling clock outputted from the rising clock delay-locked circuit and from the falling clock delay-locked circuit.

In the above configuration, preferably, the delay-locked circuit comprises a replica delay portion which makes a replica delay from the first clock to output as the second clock; a first phase detecting portion which compares the first and second clock phases to output a first detection signal; a multiplexing portion which selects any one first clock and an inverted clock having an opposite phase to this first clock; a first delay line portion which delays a clock selected from the multiplexing portion for a predetermined time to output the rising clock, and determines the delay amount by the first detection signal; a second phase detecting portion which compares the delay and locking completed rising clock and the falling clock phases to output to a second detection signal; and a second delay line portion which inverts a clock delayed from the first clock and then delays for a predetermined time to output the falling clock when the delay and locking operation for the rising clock is completed, and determines the delay amount from the second detection signal.

In the above configuration, preferably, the multiplexing portion selects any one first clock and the inverted clock using the first detection signal so as to align any one first clock and the inverted clock with the second clock for a delay time within a half period of the second clock.

In the above configuration, preferably, the multiplexing portion includes a first input buffer which uses an external clock to generate the first clock having the same phase as with the external clock; a second input buffer which uses a clock having an opposite phase to the external clock in order to generate the inverted clock having the same phase with the clock having an opposite phase to the external clock; a clock selector which generates a clock selecting signal using the first detection signal to determine which one of the first clock and the inverted clock is delayed; and a multiplexer which selects any one of the first clock and the inverted clock using the clock selecting signal to output.

In the above configuration, preferably, the first input buffer receives the external clock from a non-inverted terminal, and receives a clock having an opposite phase from the external clock to an inverted terminal.

In the above configuration, preferably, the second input buffer receives a clock having an opposite phase from the external clock from a non-inverted terminal, and receives the external clock from an inverted terminal.

In order to accomplish the above-mentioned object, still another embodiment of a delay-locked loop device is characterized by comprising: a first delay line portion which compares a phase difference between a first clock inputted as a reference and a second clock replica delayed from the first clock, then the first delay line portion delays the first clock for a predetermined time, and when the phase difference is greater than a predetermined range is generated between the first clock and the second clock, then delays the delayed clock to have a phase difference within the predetermined delay range based upon the second clock to output the rising clock; a second delay line portion which according to a result of comparing a phase difference between the delay and locking completed rising clock and the falling clock when the delay and locking operation for the rising clock is completed, inverts the clock delayed from the first clock and then delays for a predetermined time, and when it is determined that a phase difference greater than a predetermined range is generated between the delay and locking completed rising clock and the falling clock, delays the delayed clock to have a phase difference within the predetermined delay range based upon the delay and locking completed rising clock to output to the falling clock; and a duty cycle correction circuit which performs a duty cycle correction operation for the delayed-locked rising clock and falling clock to output an output clock.

In the above configuration, preferably, the first delay line portion comprises a first phase detecting portion which compares the first clock and the second clock phases to output a first detection signal; a first single coarse delay line portion which delays a clock selected from the multiplexing portion for a predetermined time to output a first delay clock, and determines a delay amount of the first delay clock using the first detection signal; a first dual coarse delay line portion which delays the first delay clock in order for the first delay clock to have a phase difference within the predetermined delay range based upon the second clock to output a second and a third delay clock when a phase difference greater than a predetermined range is generated between the first clock and the second clock is determined with the first detection signal that; and a first fine delay unit which mixes the second and the third delay clock phases to output the rising clock.

In the above configuration, preferably, the first single coarse delay line portion comprises multiple serially connected unit delay cells, and a number of unit delay cells being passed by a clock which is selected from the multiplexing portion using the first detection signal.

In the above configuration, preferably, the first dual coarse delay line portion comprises a first coarse delay line having 'n' serially connected unit delay cells (here, 'n' is an integer greater than 1) in which the first delay clock passes through 'h' activated unit delay cells (here, 'h' is an integer not more than 'n') using the first detection signal to output the second delay clock; and a second coarse delay line having 'n+1' serially connected unit delay cells in which the first delay clock passes through 'h+1' activated unit delay cells using the first detection signal to output the third delay clock.

In the above configuration, preferably, the first fine delay line portion determines a weight factor using the first detection signal, and includes a phase mixer which adds a result of multiplying a level of the second delay clock using a value of subtracting the weight factor from 1 to a result of multiplying a level of the third delay clock using the weight factor to output to the rising clock.

In the above configuration, preferably, the second delay line portion comprises a second phase detecting portion which compares the delay and locking completed rising clock and the falling clock phases to output a second detection signal; a second single coarse delay line portion which inverts a clock delayed from the first clock and then delays for a predetermined time to output a fourth delay clock when the delay and locking operation for the rising clock is completed, and determines a delay amount of the fourth delay clock using the second detection signal; a second dual coarse delay line portion which delays the fourth delay clock to have a phase difference within the predetermined delay range based upon the delay and locking completed rising clock to output to a fifth and a sixth delay clock when using the second detection signal such that a phase difference greater than a predetermined range is generated between the delay and locking completed rising clock and the falling clock; and a second fine delay unit which mixes the fifth and the sixth delay clock phases to output the falling clock.

In the above configuration, preferably, the second single coarse delay line portion inverts the first delay clock outputted from the first single coarse delay line portion, and then delays for a predetermined time to output the second delay clock.

In the above configuration, preferably, the second single coarse delay line portion comprises multiple serially connected unit delay cells, and a number of unit delay cells being passed by a clock having an opposite phase to the clock delayed from the first clock is determined by the second detection signal.

In the above configuration, preferably, the second dual coarse delay line portion comprises a first coarse delay line having 'n' serially connected unit delay cells (here, 'n' is an integer greater than 1) in which the fourth delay clock passes through 'h' activated unit delay cells (here, 'h' is an integer not more than 'n') using the second detection signal to output the fifth delay clock; and a second coarse delay line having 'n+1' serially connected unit delay cells in which the fourth delay clock passes through 'h+1' activated unit delay cells using the first detection signal to output the sixth delay clock.

In the above configuration, preferably for the second fine delay line portion, a weight factor is determined using the second detection signal, and the second fine delay line portion includes a phase mixer which adds a result of multiplying a level the fifth delay clock by a value of subtracting the weight factor from 1 to a result of multiplying a level of the sixth delay clock using the weight factor to output the falling clock.

In order to accomplish the above-mentioned object, an embodiment of a delay-locked loop method is characterized by comprising: a first step which compares a phase difference between a first clock inputted as a reference and a second clock replica delayed from this to select any one of the first clock and an inverted clock inverted from the first clock; a second step which delays the selected clock for a predetermined time to output a first delay clock; a third step which aligns the first delay clock with the second clock to lock with the rising clock; a fourth step which inverts the first delay clock and then delays the inverted first delay clock to output a second delay clock; a fifth step which aligns the second delay clock with the rising clock to lock with the falling clock; and a sixth step which corrects a duty cycle for the rising clock and falling clock.

In the above method, preferably, the first step selects any one of the first clock and the inverted clock by comparing the first clock and the second clock so as to align any one of the first clock and the inverted clock with the second clock for a delay time within a half period of the second clock.

In the above method, preferably, the second and the third step determines a delay amount for the rising clock with a signal of comparing the first clock and the second clock phases.

In the above method, preferably, the third step compares the first clock and the second clock phases and when a phase difference greater than a predetermined range is generated, corrects the first clock to have a phase difference within the predetermined delay range based upon the second clock, and then mixes the corrected clock phases to lock with the rising clock.

In the above method, preferably, the fourth and the fifth step determines a delay amount for the falling clock using a signal comparing the delay and locking completed rising clock and the falling clock phases.

In the above method, preferably, the fifth step compares the rising clock and the falling clock phases when a phase difference greater than a predetermined range is generated, subsequently corrects the second delay clock to have a phase difference within the predetermined delay range based upon the rising clock, and then mixes the corrected clock phases to lock with the falling clock.

DESCRIPTION OF SPECIFIC EMBODIMENTS

Hereinafter, an embodiment of the present invention will be described in detail with reference to the accompanying drawings.

In general, the present invention uses, inter alia, a loop including a delay model portion that compensates a skew between an external clock and data or a skew between an external clock and an internal clock.

The present invention applies, inter alia, a delay model portion that reduces a current consumption while reducing an area occupied by the delay model portion.

The present invention uses, inter alia, a complementary phase multiplexing that reduces a length of the delay line while shortening a locking time.

The present invention uses, inter alia, both a single coarse delay line and a dual coarse delay line, that solves a boundary switching problem while reducing an area and a current consumption caused by a coarse delay line.

Figure 2:
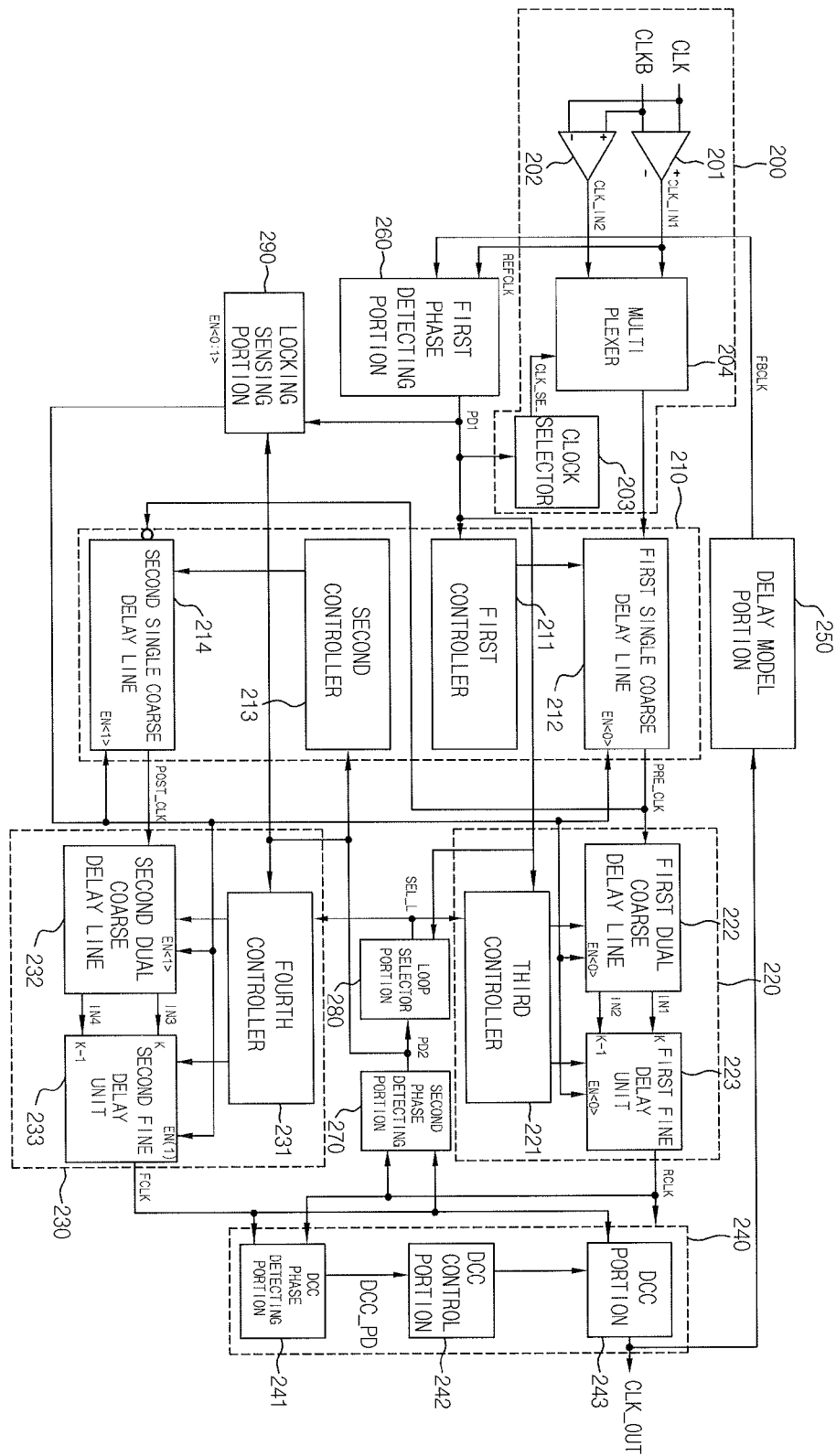
FIG. 2 is a block diagram showing a delay-locked loop according to an embodiment of the present invention.

As an embodiment of the present invention, a block diagram is disclosed as shown in FIG. 2, and according to an embodiment of the present invention, an operation is performed by selecting any one of an external clock signal (CLK) and an inverted external clock signal (CLKB) using a multiplexing portion 200, aligning the selected clock signal at a rising edge of the external clock signal (CLK) through a first single coarse delay line 212, a first dual coarse delay line 222, and a first fine delay unit 223 according to the phase comparison with a feedback clock signal (FBCLK) through a delay model portion 250, then receiving a clock signal through the first single coarse delay line 212 to the second single coarse delay line 214 to align the rising edges of the rising clock signal (RCLK) and the falling clock signal (FCLK).

Specifically, an embodiment of FIG. 2 includes a multiplexing portion 200, a delay line portion 210, a first clock phase adjustment portion 220, a second clock phase adjustment portion 230, a duty cycle correction portion 240, a delay model portion 250, a first phase detecting portion 260, a second phase detecting portion 270, a loop selector portion 280, and a locking sensing portion 290.

The multiplexing portion 200 compares a external clock signal (CLK) and a feedback clock signal (FBCLK) phases and selects any one of a external clock signal (CLK) and an inverted external clock signal (CLKB) to transmit to the delay line portion 210 such that an initially locked clock signal is delayed while being locked at a maximum range of a half period (0.5 tCK). For this purpose, the multiplexing portion 200 includes a first input buffer 201, a second input buffer 202, a clock selector 203, and a multiplexer 204.

In the multiplexing portion 200, the first input buffer 201 receives an external clock signal (CLK) to a non-inverted terminal (+) and an inverted external clock signal (CLKB) to an inverted terminal (−) to output to a first clock input signal (CLK_IN1) having a same phase with the external clock signal (CLK).

In the multiplexing portion 200, the second input buffer 202 receives an inverted external clock signal (CLKB) to a non-inverted terminal (+) and an external clock signal (CLK) to an inverted terminal (−) to output to a second clock input signal (CLK_IN2) having a same phase with the inverted external clock signal (CLKB).

In the multiplexing portion 200, the clock selector 203 receives a first detection signal (PD1) generated from the first phase detecting portion 260 to output a selection signal (CLK_SEL) for selecting any one of the first clock input signal (CLK_IN1) and the second clock input signal (CLK_IN2).

In the multiplexing portion 200, the multiplexer 204 selects any one of a plurality of the clock signals (CLK_IN1, CLK_IN2) according to the selection signal (CLK_SEL) outputted from the clock selector 203.

The delay line portion 210 uses the first and the second detection signals (PD1, PD2) respectively generated from the first and the second phase detecting portion 260 and 270, respectively, to make a coarse delay on a clock signal selected from the multiplexing portion 200. For this purpose, the delay line portion 210 includes a first controller 211, a first single coarse delay line 212, a second controller 213, and a second single coarse delay line 214.

In the delay line portion 210, the first controller 211 generates a control signal capable of controlling a delay amount of the clock signal selected from the multiplexing portion 200 according to the first detection signal (PD1) outputted from the first phase detecting portion 260.

In the delay line portion 210, the first single coarse delay line 212 receives a clock signal selected from the multiplexing portion 200 and delays according to the control signal generated from the first controller 211 to output a first delay clock signal (PRE_CLK).

Figure 3:
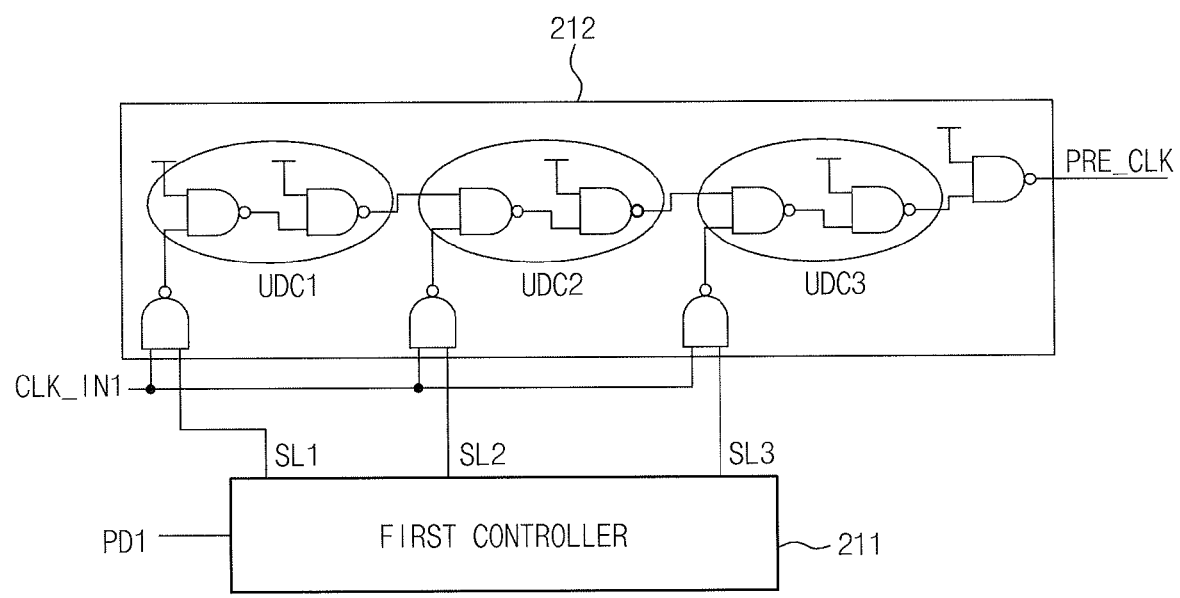
FIG. 3 is a circuit diagram illustrating a first single coarse delay line 212 of FIG. 2.

Here, the first single coarse delay line 212 can be configured as shown in FIG. 3. Specifically, the first controller 211 uses the first detection signal (PD1) outputted from the first phase detecting portion 260 to generate shift signals (SL1, SL2, SL3), and unit delay cells (UD1-UD3) are serially connected within the first single coarse delay line 212, and thus the inputted clock signal (e.g. CLK_IN1) is delayed and outputted according to the enabled shift signals (SL1, SL2, SL3).

In the delay line portion 210, the second controller 213 generates a control signal capable of controlling a delay amount of the clock signal selected from the multiplexing portion 200 in response to the second detection signal (PD2) generated from the second phase detecting portion 270.

In the delay line portion 210, the second single coarse delay line 214 receives the first delay clock signal (PRE_CLK) outputted from the first single coarse delay line 212 and delays in response to the control signal generated from the second controller 213 an output of a second delay clock signal (POST_CLK).

Here, the second single coarse delay line 214 may have a same or equivalent configuration as shown in FIG. 3, and receives the first delay clock signal (PRE_CLK) and receives the second clock input signals (CLK_IN1, CLK_IN2, respectively) similar to the structure as shown in FIG. 3 in order to output the second delay clock signal (POST_CLK) The first clock phase adjustment portion 220 uses a first detection signal (PD1) generated from the first phase detecting portion 260 and a loop selection signal (SEL_L) generated from the loop selector portion 280 to perform a fine delay on the first delay clock signal (PRE_CLK) outputted from the first single coarse delay line 212. For this purpose, the first clock phase adjustment portion 220 includes a third controller 221, a first dual coarse delay line 222, and a first fine delay unit 223.

In the first clock phase adjustment portion 220, the third controller 221 generates a control signal capable of controlling a delay amount of the first delay clock signal (PRE_CLK) outputted from the first single coarse delay line 212 in response to the first detection signal (PD1) generated from the first phase detecting portion 260 and in response to the loop selection signal (SEL_L) generated from the loop selector portion 280.

In the first clock phase adjustment portion 220, the first dual coarse delay line 222 receives the first delay clock signal (PRE_CLK) outputted from the first single coarse delay line 212 and delays in response a control signal generated from the third controller 221 outputs of two clock signals (IN1, IN2) each having a different delay amount.

In the first clock phase adjustment portion 220, the first fine delay unit 223 determines a weight factor (K) in response to the control signal generated from the third controller 221, and then mixes two clock signals (IN1, IN2) outputted from the first dual coarse delay line 222 in response to the weight factor (K) output to a rising clock signal (RCLK).

The second clock phase adjustment portion 230 uses a second detection signal (PD2) generated from the second phase detecting portion 270 and uses a loop selection signal (SEL_L) generated from the loop selector portion 280 to perform a fine delay on the second delay clock signal (POST_CLK) outputted from the second single coarse delay line 214. For this purpose, the second clock phase adjustment portion 230 includes a fourth controller 231, a second dual coarse delay line 232, and a second fine delay unit 233.

In the second clock phase adjustment portion 230, the fourth controller 231 generates a control signal capable of controlling a delay amount of the second delay clock signal (POST_CLK) outputted from the second single coarse delay line 214 in response to the second detection signal (PD2) generated from the second phase detecting portion 270 and in response to the loop selection signal (SEL_L) generated from the loop selector portion 280.

In the second clock phase adjustment portion 230, the second dual coarse delay line 232 receives the second delay clock signal (POST_CLK) outputted from the second single coarse delay line 214 and delays in response to a control signal generated from the fourth controller 231 to output to two clock signals (IN3, IN4) each having a different delay amount.

In the second clock phase adjustment portion 230, the second fine delay unit 233 determines a weight factor (K) in response to the control signal generated from the fourth controller 231, and then mixes the two clock signals (IN3, IN4) outputted from the second dual coarse delay line 232 in response to the weight factor (K) to output a falling clock signal (FCLK).

The duty cycle correction (DCC) portion 240 receives the rising clock signal (RCLK) and receives the falling clock signal (FCLK) and performs a phase blending between the rising clock signal (RCLK) and the falling clock signal (FCLK) to output an output clock signal (CLK_OUT). For this purpose, the duty cycle correction portion 240 includes a DCC phase detecting portion 241, a DCC control portion 242, and a DCC portion 243.

In the duty cycle correction portion 240, the DCC phase detecting portion 241 compares the rising clock signal (RCLK) outputted from the first fine delay unit 223 and a falling clock signal (FCLK) outputted from the second fine delay unit 233 to generate a DCC comparison signal (DCC_PD).

In the duty cycle correction portion 240, the DCC control portion 242 uses the DCC comparison signal (DCC_PD) generated from the DCC phase detecting portion 241 to generate control signals to the DCC portion 243 for controlling a phase mixing operation.

In the duty cycle correction portion 240, the DCC portion 243 performs a phase mixing operation between the rising clock signal (RCLK) and the falling clock signal (FCLK) with the control signals generated from the DCC control portion 242 to output an output clock signal (CLK_OUT).

Figure 4:
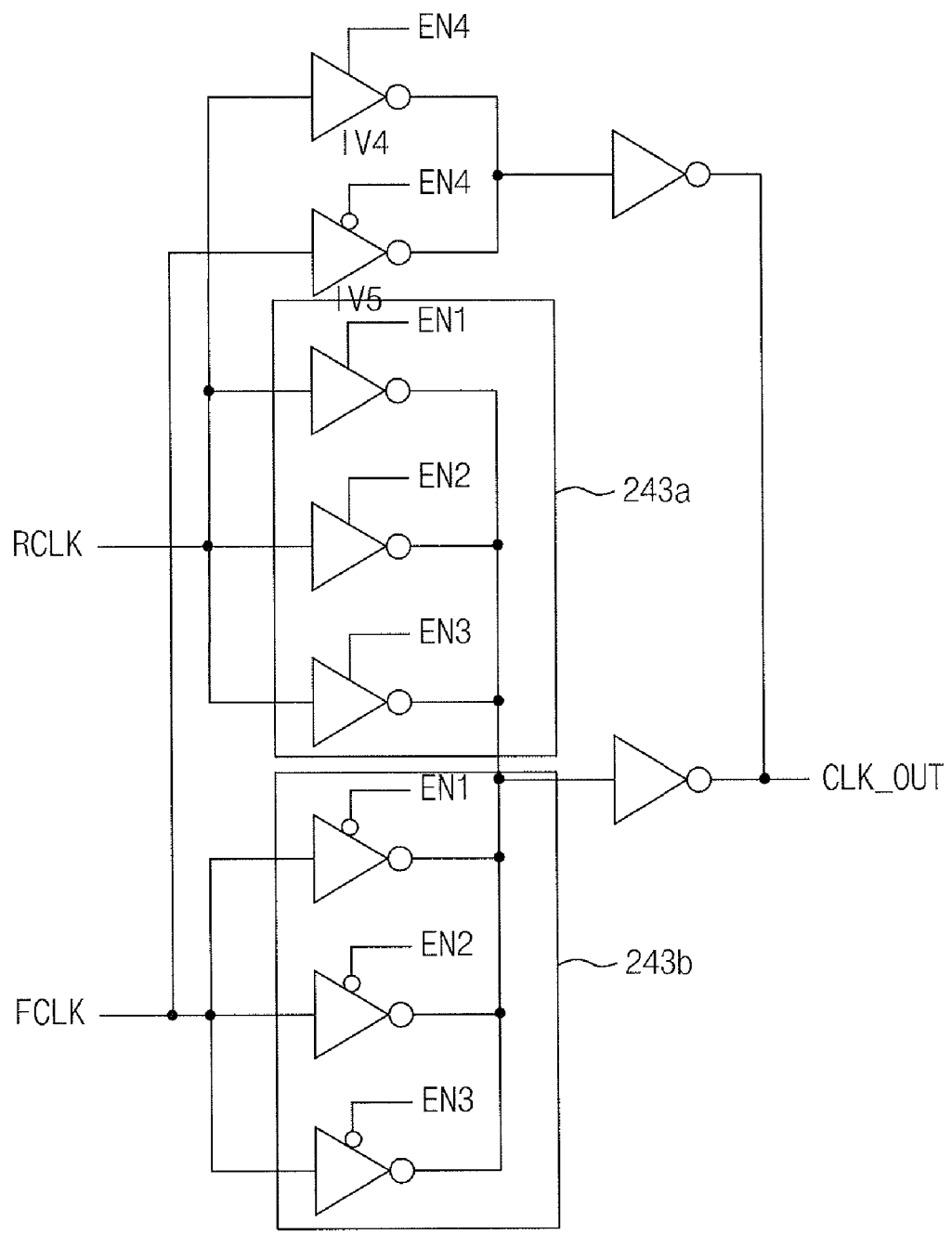
FIG. 4 is a circuit diagram illustrating a DCC portion 243 of FIG. 2.

Here, the DCC portion 243 can be configured as shown in FIG. 4, and the output clock signal (CLK_OUT) is outputted by a half-blending between an inverter group 243a and inverter group 243b, and by a half-blending between an inverter (IV4) and an inverter (IV5) by control signals (EN1-EN4) generated from the DCC control portion 242.

The delay model portion 250 receives the rising clock signal (RCLK) initially generated by the external clock signal (CLK) and makes a replica delay to output to a feedback clock signal (FBCLK).

The first phase detecting portion 260 receives the external clock signal (CLK) and compares with the feedback clock signal (FBCLK) outputted from the delay model portion 250 to generate a first detection signal (PD1).

The second phase detecting portion 270 receives the rising clock signal (RCLK) outputted from the first fine delay unit 223 and compares with the falling clock signal (FCLK) outputted from the second fine delay unit 233 to generate a second detection signal (PD2).

The loop selector portion 280 uses the second detection signal (PD2) generated from the second phase detecting portion 270 to generate a loop selection signal (SEL_L) for selecting any one of the first clock phase adjustment portion 220 and the second clock phase adjustment portion 230.

Figure 5:
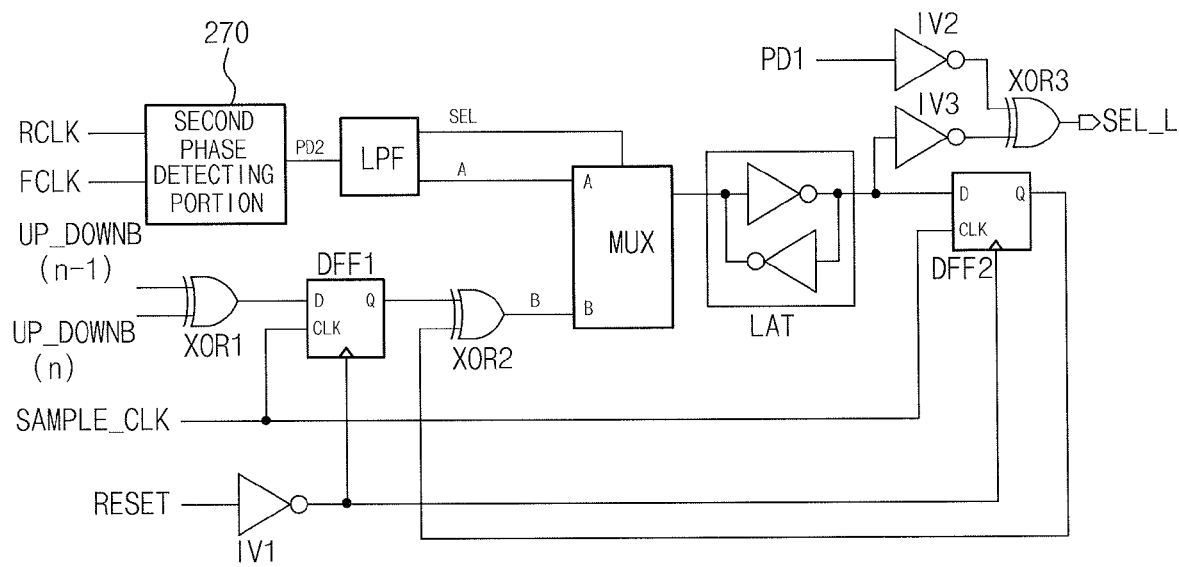
FIG. 5 is a circuit diagram illustrating a loop selector portion 280 of FIG. 2.

Here, the loop selector portion 280 can be configured as shown in FIG. 5. Specifically, a second detection signal (PD2) of the second phase detecting portion 270 is inputted to a low-pass filter (LPF), and when the second detection signal (PD2) corresponds to the detected phase difference, the low-pass filter (LPF) outputs a selection signal (SEL) to the multiplexer (MUX) and controls the selection of an output 'A' of the multiplexer (MUX). Otherwise, the multiplexer (MUX) is set to select an output 'B' from an Exclusive-OR (XOR2).

Then, the output of the multiplexer (MUX) is latched in a latch (LAT) and an inverted signal by an inverter (IV2) and an inverted signal by an inverter (IV3) are logically combined to output to a loop selection signal (SEL_L).

On the other hand, in the loop selector portion 280, when a phase adjustment is made repetitively in the same direction in the second single coarse delay line 214, the second dual coarse delay line 232, and the second fine delay unit 233, a previous staged control signal (UP_DOWNB(n−1)) and a present control signal (UP_DOWNB(n)) are logically combined by an Exclusive-OR (XOR1) and provided to an input terminal of a D-Flipflop (DFF1), and the output of the Exclusive-OR (XOR1) is applied to an Exclusive-OR (XOR2). Furthermore, the Exclusive-OR (XOR2) performs a logic operation on an output of the D-Flipflop (DFF1) and an output of a D-Flipflop (DFF2) from which a latched output from the latch (LAT) is inverted and outputted to provide to an input 'B' of the multiplexer (MUX).

Accordingly, the loop selector portion 280 provides a loop selection signal (SEL_L) for a loop which has to currently perform a delay (the first dual coarse delay line 222 and the first fine delay unit 223, or the first fine delay unit 223 and the second dual coarse delay line 232).

The locking sensing portion 290 controls an operation of the first single coarse delay line 212, the first dual coarse delay line 222, and the first fine delay unit 223 with the first detection signal (PD1) generated from the first phase detecting portion 260, and controls an operation of the second single coarse delay line 214, the second dual coarse delay line 232, and the second fine delay unit 233 with second detection signal (PD2) generated from the second phase detecting portion 270.

Specifically looking into an operation in an embodiment of the invention having such a configuration, the multiplexing portion 200 compares the external clock signal (CLK) and the feedback clock signal (FBCLK) phases and selects any one external clock signal (CLK) and an inverted external clock signal (CLKB) such that an initially locked clock signal is delayed while being locked at a maximum range of a half period (0.5 tCK). Accordingly, it is enough that the first single coarse delay line 212 has unit delay cells as much as a maximum of a half period (0.5 tCK).

At this time, the feedback clock signal (FBCLK) is a feedback signal for which the rising clock signal (RCLK) is initially generated by the external clock signal (CLK), and then this rising clock signal (RCLK) passes through the delay model portion 250 by way of the duty cycle correction portion 240.

Then, when the first phase detecting portion 260 provides the first detection signal (PD1) to the first controller 211 to make a delay as much as 'a' units for a clock signal passing through the first single coarse delay line 212, the first single coarse delay line 212 performs a delay on a signal selected from the multiplexing portion 200 as much as 'a' units to output a first delay clock signal (PRE_CLK). At this time, the second single coarse delay line 214, the second dual coarse delay line 232, and the second fine delay unit 233 maintain a deactivated state.

Then, the first delay clock signal (PRE_CLK) outputted from the first single coarse delay line 212 is outputted as the rising clock signal (RCLK) through the first clock phase adjustment portion 220.

Here, the first dual coarse delay line 222 of the first clock phase adjustment portion 220 includes an upper coarse delay line and a lower coarse delay line, and a number of the unit delay lines in the upper coarse delay line can include one less than, or one more than a number of the unit delay lines in the lower coarse delay line.

Figure 6:
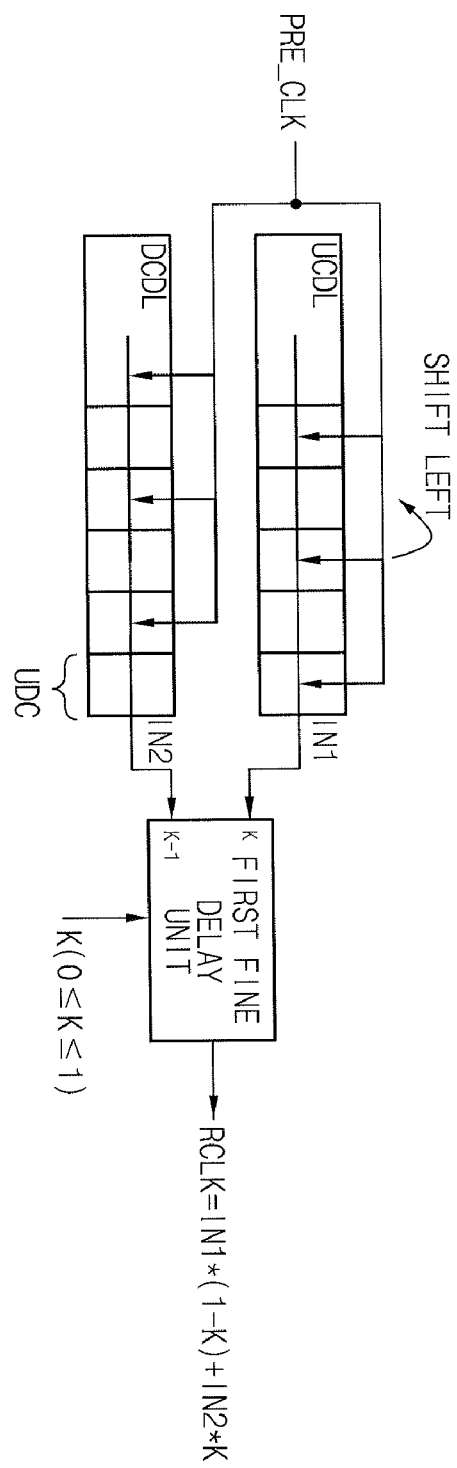
FIG. 6 is a block diagram for explaining an operation of a first dual coarse delay line 222 and a first fine delay unit 223 of FIG. 2.

Furthermore, as a weight factor (K) of the first fine delay unit 223 is determined from the first detection signal (PD1) of the first phase detecting portion 260, and controlled by a control signal outputted from the third controller 221, as illustrated in FIG. 6, a number of unit delay cells (UDC) used for a delay within the upper coarse delay line (UCDL) of the first dual coarse delay line 222 is changed to 1, 3, 5, and so on, and a number of unit delay cells (UDC) used for a delay within the lower coarse delay line (DCDL) of the first dual coarse delay line 222 is changed to 2, 4, 6, and so on. At this time, the numbers of the unit delay cells (UDC) used for a delay in the upper coarse delay line (UCDL) and the lower coarse delay line (DCDL) are numbers adjacent to each other.

Figure 7:
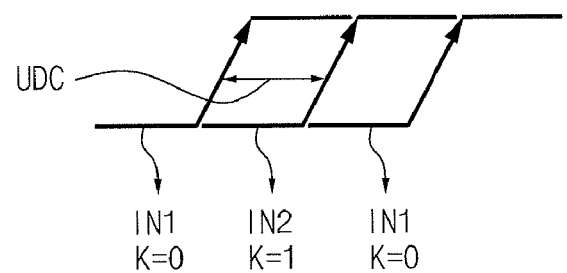
FIG. 7 is a waveform diagram for explaining a first dual coarse delay line 222 of FIG. 6.

For example, when a clock signal passing through the upper coarse delay line (UCDL) is outputted by way of a 3-staged unit delay cell (UDC), and a clock signal passing through the lower coarse delay line (DCDL) is outputted by way of a 4-staged unit delay cell (UDC) according to the control signal outputted from the third controller 221, specifically looking into an operation of the first clock phase adjustment portion 220 with reference to FIGS. 6 and 7, if a weight factor (K) of the first fine delay unit 223 is determined as '0' by the first detection signal (PD1), the clock signal passed through the upper coarse delay line (UCDL) is outputted as it is.

On the contrary, when it is determined by the first phase detecting portion 260 that a phase of the feedback clock signal (FBCLK) is advanced than a phase of the external clock signal (CLK), the first fine delay unit 223 increases a weight factor (K), and as the weight factor (K) approaches to '1', of two clock signals applied to the input (IN1) and the input (IN2), the first fine delay unit 223 outputs a clock signal which is close to a phase of a clock signal applied to the input (IN2). Then, if the weight factor (K) becomes '1', the first fine delay unit 223 outputs only a clock signal applied to the input (IN2).

Here, the rising clock signal (RCLK) outputted from the first fine delay unit 223 can be represented as an equation.

$$RCLK=IN1*(1-K)+IN2*K \quad \text{[Equation 1]}$$

Even at this time, when it is still determined by the first phase detecting portion 260 that a phase of the feedback clock signal (FBCLK) is advanced than a phase of the external clock signal (CLK), the first fine delay unit 223 controls such that a shift left is performed in the upper coarse delay line (UCDL) which is irrelevant to a clock signal applied to the input (IN2) of the first fine delay unit 223.

In other words, the upper coarse delay line (UCDL) outputs a clock signal by way of 3-staged unit delay cell (UDC), and then outputs it by way of 5-staged unit delay cell (UDC). At this time, since the weight factor (K) is '1', only a clock signal outputted from the lower coarse delay line (DCDL) is outputted, and therefore a delay amount change in the upper coarse delay line (UCDL) does not affect on the output of the first fine delay unit 223. Accordingly, a seamless boundary switching is possible.

In this way, when it is required to increase a delay of the feedback clock signal (FBCLK) even after generating a shift left in the upper coarse delay line (UCDL), it is attainable by decreasing the weight factor (K). A decrease of the weight factor (K) means that it approaches from a phase of the clock signal applied to the input (IN2) to a phase of the clock signal applied to the input (IN1) in the first fine delay unit 223.

Furthermore, when it is required to decrease a delay, it will be obvious to those skilled in the art that it is attainable by inversely applying the afore-described method, and thus a more detailed explanation will be avoided here.

Furthermore, the upper coarse delay line (UCDL) and the lower coarse delay line (DCDL) can be provided with a shift left or shift right function, and the first fine delay unit 223 capable of determining a weight factor (K) using the first detection signal (PD1) of the first phase detecting portion 260 can be configured by a variety of methods using an up-down counter and a decoder.

Moreover, after performing a coarse delay operation, it is enough to process only a portion which can be varied by external noises such as power voltage variation by means of a fine delay operation, so a physical length of the upper coarse delay line (UCDL) and the lower coarse delay line (DCDL) is sufficient if it is to an extent that can be varied by external noises.

Then, the locking sensing portion 290 senses whether the rising clock signal (RCLK) is locked or not with the second detection signal (PD2) of the second phase detecting portion 270, and when the rising clock signal (RCLK) is locked, the first dual coarse delay line 222 and the first fine delay unit 223 are deactivated, and the second single coarse delay line 214, the second dual coarse delay line 232, and the second fine delay unit 233 are activated.

When the second single coarse delay line 214, the second dual coarse delay line 232, and the second fine delay unit 233 are activated by the locking sensing portion 290, the second single coarse delay line 214 receives a phase inverted signal of the first delay clock signal (PRE_CLK) outputted from the first single coarse delay line 212 to make a delay as much as 'β' units. The delay amount is determined at this time, for the second phase detecting portion 270, to provide the second detection signal (PD2) to the second controller 213 for the clock signal passing through the second single coarse delay line 214 to make a delay as much as 'β' units.

Figure 8:
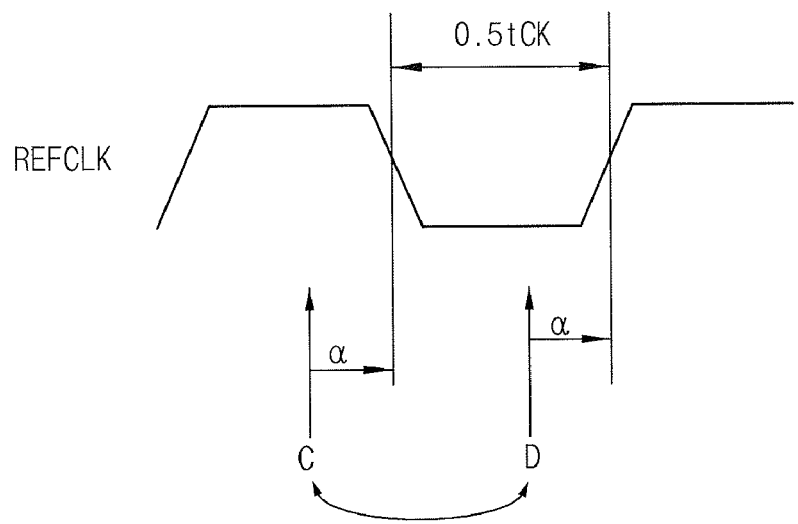
FIG. 8 is a waveform diagram for explaining a first and a second single coarse delay line 212 and 214.

At this time, when the feedback clock signal (FBCLK), as illustrated in FIG. 8, is delayed at the position of 'D' as much as 'α' units through the first single coarse delay line 212 and outputted to the first delay clock signal (PRE_CLK), the first delay clock signal (PRE_CLK) inputted to the second single coarse delay line 214 is delayed as much as 'α' units at the position 'C', and therefore it is enough the second single coarse delay line 214 has a delay line as much as a maximum of a half period (0.5 tCK).

Then, the clock signal delayed as much as 'α+β' units, that is, the second delay clock signal (POST_CLK) is outputted to the falling clock signal (FCLK) through the second clock phase adjustment portion 230. Here, the second clock phase adjustment portion 230 performs a same operation as that of the first clock phase adjustment portion 220 as described above, and a more detailed explanation about this will be omitted.

Then, the second phase detecting portion 270 compares the rising clock signal (RCLK) and the falling clock signal (FCLK) and provides a comparison signal (PD2) to the loop selector portion 280. Furthermore, the loop selector portion 280 selects any one of the third controller 221 and the fourth controller 231 to delay again any one of the rising clock signal (RCLK) and the falling clock signal (FCLK) according to the comparison signal (PD2), and any one of the rising clock signal (RCLK) and the falling clock signal (FCLK) is finely delayed again by the selected controller.

After a delay amount is adjusted again by the loop selection signal (SEL_L), when the rising edges of the rising clock signal (RCLK) and the falling clock signal (FCLK) are aligned, the duty cycle correction portion 240 performs a phase mixing operation between the rising clock signal (RCLK) and the falling clock signal (FCLK) to output to an output clock signal (CLK_OUT).

Accordingly, the present invention provides ways for realizing a delay-locked loop device for compensating a skew between an external clock and data or a skew between an external clock and an internal clock by using one delay model portion.

Furthermore, according to the present invention, by applying one delay model portion, an unnecessary current consumption can be reduced compared to a conventional device which is applied with a dual delay model portion, and an area occupied by the delay model portion can be reduced, thereby providing an effect of securing an area as much as that reduced area.

Furthermore, according to the present invention, by using a complementary phase multiplexing, a length of the delay line can be reduced, thereby providing an effect of shortening a locking time.

Moreover, according to the present invention, by cascading the delay lines, a locking time can be shortened, and accordingly a physical length of the delay line can be reduced to provide an effect of reducing the area and current consumption.

Though the present invention has been illustrated and described regarding a particular embodiment, the invention should not be so limited, and it will be appreciated that the invention may be altered or modified in various ways by those skilled in the art without departing from the spirit and scope of the invention as set forth in the appended claims.

What is claimed is:

1. A delay-locked loop device comprising:
a rising clock delay-locked circuit which performs a delay and locking operation for generating a rising clock using a first clock inputted as a reference and using a second clock in which the second clock is replica delayed from the first clock, and
if a phase difference between the first and second clocks is greater than a predetermined range then the rising clock delay-locking circuit performs the delay and locking operation wherein a dual coarse delay line corrects the first clock such that the phase difference between the first and second clocks is within the predetermined range;
a falling clock delay-locked circuit which performs a delay and locking operation for generating a falling clock using the first clock after the delay and locking operation for generating the rising clock is completed;
a control circuit which controls the rising clock delay-locked circuit and controls the falling clock delay-locked circuit by sequentially controlling the delay and locking operations for generating the rising clock and the falling clock; and
a duty cycle correction circuit which performs a duty cycle correction operation for generating an output clock from the delayed-locked rising clock and the delay-locked falling clock respectively outputted from the rising clock delay-locked circuit and from the falling clock delay-locked circuit such that the outputted clocks are respectively inputted into the duty cycle correction circuit for generating the output clock,
wherein the control circuit comprises:
a first control portion configured to control a delay and locking operation for the rising clock using a first detection signal generated by comparing the first and the second clock phases;
a second control portion configured to control a delay and locking operation for the falling clock using a second detection signal generated by comparing the delay and locking completed rising clock and the failing clock phases; and
a loop selector portion configured to select any one of the first and the second control portions using the second detection signal.

2. The delay-locked loop device of claim 1 wherein the rising clock delay-locked circuit comprises a replica delay portion which outputs the second clock (FB-CLK) wherein the second clock (FB_CLK) is a replica delay of the first clock (CLK_IN1);
a first phase detecting portion which compares the first and second clock phases and outputs a first detection signal (PD1); a multiplexing portion which uses the first detection signal (PD1) to select any one first clock (CLK_IN1) and to select an inverted clock (CLK_IN2), the inverted clock (CLK_IN2) having an opposite phase to the any one first clock (CLK_IN1);
a first single coarse delay line portion that receives a clock signal selected from the multiplexing portion and receives the first detection signal (PD1) from a first controller portion, the first single coarse delay line portion outputs a first delay clock (PRE_CLK) at a predetermined amount of time relative to a receipt time of the clock signal from the multiplexer, the predetermined amount of time to output the first delay clock is determined by the first single coarse delay line portion using the first detection signal; the dual coarse delay line comprising a first dual coarse delay line portion which delays the first delay clock to have a phase difference within the predetermined delay range based upon the second clock to output to a second and a third delay clock when the phase difference between the first clock and the second clock is determined to be greater than a predetermined range; and a first fine delay unit which mixes the second and the third delay clock phases to output the rising clock.

3. The delay-locked loop device of claim 2 wherein the multiplexing portion selects any one first clock and the inverted clock using the first detection signal to align any one first clock and the inverted clock with the second clock to delay the any one first clock and the inverted clock to within a half period of the second clock.

4. The delay-locked loop device of claim 3 wherein the multiplexing portion includes a first input buffer which uses an external clock to generate the first clock having a phase substantially equivalent to the phase of the external clock; a second input buffer which uses a clock having a phase substantially opposite to the phase of the external clock for generating the inverted clock having a phase substantially opposite to the phase of the external clock; a clock selector which generates a clock selecting signal using the first detection signal to determine which one of the first clock and the inverted clock is delayed; and a multiplexer which selects any one of the first clock and the inverted clock using the clock selecting signal output.

5. The delay-locked loop device of claim 4 wherein the first input buffer receives the external clock to a non-inverted terminal, and receives a clock having a phase substantially opposite to the phases of the external clock and an inverted terminal.

6. The delay-locked loop device of claim 4 wherein the second input buffer receives a clock having a phase substantially opposite to the phases of the external clock and a non-inverted terminal, and the second input buffer receives the external clock from an inverted terminal.

7. The delay-locked loop device of claim 2 wherein the first single coarse delay line portion comprises multiple serially connected unit delay cells, and a number of unit delay cells for passing a clock which is selected from the multiplexing portion in which the first detection signal is used by the multiplexing portion to select the clock.

8. The delay-locked loop device of claim 2 wherein the first dual coarse delay line portion comprises a first coarse delay line having 'n' serially connected unit delay cells (here, 'n' is an integer greater than 1) in which the first delay clock passes through 'h' activated unit delay cells (here, 'h' is an integer not more than 'n') which uses the first detection signal to output to the second delay clock; and a second coarse delay line having 'n+1' serially connected unit delay cells in which the first delay clock passes through 'h+1' activated unit delay cells which uses the first detection signal to output the third delay clock.

9. The delay-locked loop device of claim 2 wherein the first fine delay line portion determines a weight factor using the first detection signal, and the first fine delay line portion includes a phase mixer which adds a result of multiplying a level of the second delay clock using a value of subtracting the weight factor from 1 to a result of multiplying a level of the third delay clock using the weight factor to output the rising clock.

10. The delay-locked loop device of claim 2 wherein the falling clock delay-locked circuit comprises:

a second phase detecting portion which compares the delay and locking completed rising clock and the falling clock phases to output a second detection signal;

a second single coarse delay line portion which inverts a clock delayed from the first clock and then output delays for a predetermined time a fourth delay clock when the delay and locking operation for the rising clock is completed, and the second phase detecting portion determines a delay amount of the fourth delay clock using the second detection signal;

a second dual coarse delay line portion for delaying the fourth delay clock to have a phase difference within the predetermined delay range based upon the delay and locking completed rising clock to output to a fifth and a sixth delay clock when it is determined with the second detection signal that a phase difference greater than a predetermined range is generated between the delay and locking completed rising clock and the falling clock; and a second fine delay unit which mixes the fifth and the sixth delay clock phases to output to the falling clock.

11. The delay-locked loop device of claim 10 wherein the second single coarse delay line portion inverts the first delay clock outputted from the first single coarse delay line portion, and then delays for the predetermined time to output the first delay clock to the second delay clock.

12. The delay-locked loop device of claim 10 wherein the second single coarse delay line portion comprises multiple serially connected unit delay cells, and a number of unit delay cells being passed by a clock having an opposite phase to the clock delayed from the first clock is determined using the second detection signal.

13. The delay-locked loop device of claim 10 wherein the second dual coarse delay line portion comprises a first coarse delay line having 'n' serially connected unit delay cells (here, 'n' is an integer greater than 1) in which the fourth delay clock passes through 'h' activated unit delay cells (here, 'h' is an integer not more than 'n') using the second detection signal to output to the fifth delay clock; and a second coarse delay line having 'n+1' serially connected unit delay cells in which the fourth delay clock passes through 'h+1' activated unit delay cells the second dual coarse delay line portion using the first detection signal outputs the sixth delay clock.

14. The delay-locked loop device of claim 10 wherein the second fine delay line portion determines a weight factor by the second detection signal, and includes a phase mixer which adds a result of multiplying a level of the fifth delay clock using a value of subtracting the weight factor from 1 to a result of multiplying a level of the sixth delay clock in which the second fine delay line portion uses the weight factor to outputs the falling clock.

15. The delay-locked loop device of claim 1 wherein the control circuit further comprises a locking sensing portion configured to control a delay and locking operation for the rising clock and a delay locking operation for the falling clock using the first and the second detection signals.

16. The delay-locked loop device of claim 15 wherein the locking sensing portion deactivates a delay and locking operation for the falling clock before a delay and locking operation for the rising clock is completed, and the locking sensing portion activates a delay and locking operation for the falling clock when the delay and locking operation for the rising clock is completed.

17. The delay-locked loop device of claim 1 wherein the duty cycle correction circuit comprises a third phase detecting portion which compares the rising clock and the falling clock phases to output to a third detection signal; a duty cycle correction control portion which generates control signals for controlling a phase mixing operation using the third detection signal; and a duty cycle correction portion which performs a phase mixing operation between the rising clock and the falling clock using the control signals generated from the duty cycle correction control portion to output the output clock.

18. The delay-locked loop device which compensates a skew between an external clock and an internal clock or between an external clock and data when a clock coming from outside of the device is used inside the device, comprising:

a delay-locked circuit which performs a delay and locking operation for a rising clock using any one first clock as a reference and a clock inverted from this, and a second clock replica delayed from the first clock, and the delay-locked circuit performs a delay and locking operation for a falling clock using the first clock when the delay and locking operation for the rising clock is completed; and a duty cycle correction circuit which performs a duty cycle correction operation for the delayed-locked rising clock and falling clock outputted using the rising clock delay-locked circuit and using the falling clock delay-locked circuit, wherein the delay-locked circuit comprises a replica delay portion which makes a replica delay on the first clock to output the second clock; a first phase detecting portion which compares the first clock and the second clock phases to output a first detection signal; a multiplexing portion which selects any one first clock and an inverted clock having an opposite phase to the any one first clock; a first delay line portion delays a clock selected from the multiplexing portion for a predetermined time to output the rising clock, and the first delay line portion determines the delay amount by the first detection signal; a second phase detecting portion compares the delay and locking completed rising clock and the falling clock phases to output a second detection signal; and a second delay line portion for inverting a clock delayed from the first clock and then for delaying the clock for a predetermined time to output the falling clock when the delay and locking operation for the rising clock is completed, and the second delay line portion determines the delay amount using the second detection signal.

19. The delay-locked loop device wherein claim 18 wherein the multiplexing portion selects any one first clock and the inverted clock using the first detection signal for aligning any one first clock and the inverted clock with the second clock to delay the first clock and the inverted clock within a half period of the second clock.

20. The delay-locked loop device of claim 19 wherein the multiplexing portion includes a first input buffer which uses the external clock to generate the first clock having a phase substantially equivalent to a phase of the external clock; a second input buffer which uses a clock having an opposite phase to the external clock to generate the inverted clock having a same phase with the clock having an opposite phase to the external clock; a clock selector which generates a clock selecting signal with the first detection signal to determine which one of the first clock and the inverted clock is delayed; and a multiplexer which selects any one of the first clock and the inverted clock by the clock selecting signal to output.

21. The delay-locked loop device of claim 20 wherein the first input buffer receives the external clock to a non-inverted terminal, and receives a clock having an opposite phase to the external clock to an inverted terminal.

22. The delay-locked loop device of claim 20 wherein the second input buffer receives a clock having an opposite phase to the external clock to a non-inverted terminal, and receives the external clock to an inverted terminal.

23. A delay-locked loop device which compensates a skew between an external clock and an internal clock or skew between an external clock and data when a clock coming from the outside of the device is used in the inside of the device, comprising:

a first delay line portion which compares a phase difference between a first clock inputted as a reference clock and a second clock replica delayed from the first clock, delays the first clock for a predetermined time, and if it is determined that a phase difference greater than a predetermined range is generated between the first clock and the second clock, then the delayed first clock is delayed to have a phase difference within the predetermined delay range based upon the second clock to output a rising clock;

a second delay line portion which compares a phase difference between the delay and locking completed rising clock and a falling clock when the delay and locking operation for the rising clock is completed, inverts the delayed first clock and then delays for a predetermined time, and if a phase difference greater than a predetermined range, that is generated between the delay and locking completed rising clock and the falling clock, then the delayed first clock is delayed to have a phase difference within the predetermined delay range based upon the delay and locking completed rising clock to output the falling clock; and a duty cycle correction circuit which performs a duty cycle correction operation for the delayed-locked rising clock and falling clock to output an output clock.

24. The delay-locked loop device of claim 23 wherein the first delay line portion comprises a first phase detecting portion which compares the first clock and the second clock phases to output to a first detection signal; a first single coarse delay line portion which delays a clock selected from the multiplexing portion for a predetermined time to output to a first delay clock, and determines a delay amount of the first delay clock by the first detection signal; a first dual coarse delay line portion which delays the first delay clock to have a phase difference within the predetermined delay range based upon the second clock to output to a second and a third delay clock when it is determined with the first detection signal that a phase difference greater than a predetermined range is generated between the first clock and the second clock; and a first fine delay unit which mixes the second and the third delay clock phases to output to the rising clock.

25. The delay-locked loop device of claim 24 wherein the first single coarse delay line portion comprises multiple serially connected unit delay cells, and a number of unit delay cells being passed by a clock which is selected from the multiplexing portion is determined by the first detection signal.

26. The delay-locked loop device of claim 24 wherein the first dual coarse delay line portion comprises a first coarse delay line having 'n' serially connected unit delay cells (here, 'n' is an integer greater than 1) in which the first delay clock passes through 'h' activated unit delay cells (here, 'h' is an integer not more than 'n') by the first detection signal to output to the second delay clock; and a second coarse delay line having 'n+1' serially connected unit delay cells in which the first delay clock passes through 'h+1' activated unit delay cells by the first detection signal to output the third delay clock.

27. The delay-locked loop device of claim 24 wherein the first fine delay line portion determines a weight factor by the first detection signal, and includes a phase mixer which adds a result of multiplying a level of the second delay clock by a value of subtracting the weight factor from 1 to a result of multiplying a level of the third delay clock by the weight factor to output the rising clock.

28. The delay-locked loop device of claim 24 wherein the second delay line portion comprises:

a second phase detecting portion which compares the delay and locking completed rising clock and the falling clock phases to output a second detection signal;

a second single coarse delay line portion which inverts a clock delayed from the first clock and then delays for a predetermined time to output to a fourth delay clock when the delay and locking operation for the rising clock is completed, and determines a delay amount of the fourth delay clock by the second detection signal;

a second dual coarse delay line portion which delays the fourth delay clock to have a phase difference within the predetermined delay range based upon the delay and locking completed rising clock to output to a fifth and a sixth delay clock when it is determined with the second detection signal that a phase difference greater than a predetermined range is generated between the delay and locking completed rising clock and the falling clock; and a second fine delay unit which mixes the fifth and the sixth delay clock phases to output the falling clock.

29. The delay-locked loop device of claims 28 wherein the second single coarse delay line portion inverts the first delay clock outputted from the first single coarse delay line portion, and then delays for a predetermined time to output to the second delay clock.

30. The delay-locked loop device of claim 28 wherein the second single coarse delay line portion comprises multiple serially connected unit delay cells, and a number of unit delay cells being passed by a clock having an opposite phase to the clock delayed from the first clock is determined by the second detection signal.

31. The delay-locked loop device of claim 28 wherein the second dual coarse delay line portion comprises a first coarse delay line having 'n' serially connected unit delay cells (here, 'n' is an integer greater than 1) in which the fourth delay clock passes through 'h' activated unit delay cells (here, 'h' is an integer not more than 'n') by the second detection signal to output to the fifth delay clock; and a second coarse delay line having 'n+1' serially connected unit delay cells in which the fourth delay clock passes through 'h+1' activated unit delay cells by the first detection signal to output to the sixth delay clock.

32. The delay-locked loop device of claim 28 wherein a weight factor is determined for the second fine delay line portion by the second detection signal, and the second fine delay line portion includes a phase mixer which adds a result of multiplying a level of the fifth delay clock by a value of subtracting the weight factor from 1 to a result of multiplying a level of the sixth delay clock by the weight factor to output to the falling clock.

33. A delay-locked loop method comprising:

comparing a phase difference between a first clock inputted as a reference clock and a second clock replica delayed from the reference clock to select any one of the first clock and an inverted clock wherein the inverted clock is inverted from the reference clock;

delaying the selected clock for a predetermined time to output to a first delay clock;

aligning a rising edge of the first delay clock with the second clock to lock with a rising clock;

converting the first delay clock and then delaying the first delay clock to output to a second delay clock;

aligning a rising edge of the second delay clock with the rising clock to lock with a falling clock; and correcting a duty cycle for the rising clock and falling clock, wherein the aligning the rising edge of the second delay clock with the rising clock to lock with the falling clock further comprises comparing the rising clock and the falling clock phases and when a phase difference greater than a predetermined range is generated, corrects the second delay clock to have a phase difference within the predetermined delay range based upon the rising clock, and then aligns the rising edge of the corrected second delay clock with the rising clock to lock with the falling clock.

34. The delay-locked loop method of claim 33 wherein the comparing the phase difference between the first clock inputted as the reference clock and the second clock replica comprises selecting any one of the first clock and the inverted clock by comparing the first clock and the second clock so as to align the rising edge of any one of the first clock and the inverted clock with the second clock for a delay time within a half period of the second clock.

35. The delay-locked loop method of claim 33 wherein the delaying the selected clock for the predetermined time and aligning the rising edge of the first delay clock with the second clock comprises determining a delay amount for the rising clock with a signal of comparing the first clock and the second clock phases.

36. The delay-locked loop method of claim 33 wherein the aligning the rising edge of the first delay clock with the second clock comprises comparing the first clock and the second clock phases and when a phase difference greater than a predetermined range is generated, corrects the first clock to have a phase difference within the predetermined delay range based upon the second clock, and then mixes the corrected clock phases to lock with the rising clock.

37. The delay-locked loop method of claim 33 wherein converting the first delay clock and then delaying the first delay clock and aligning the rising edge of the second delay clock with the rising clock comprises determining a delay amount for the falling clock with a signal of comparing the delay and locking completed rising clock phase and the delay and locking completed falling clock phase.

* * * * *